United States Patent
Kobayashi et al.

(10) Patent No.: US 6,777,968 B1
(45) Date of Patent: Aug. 17, 2004

(54) PROBING METHOD AND PROBING APPARATUS IN WHICH STEADY LOAD IS APPLIED TO MAIN CHUCK

(75) Inventors: Masahito Kobayashi, Fuchu (JP); Kazunari Ishii, Nirasaki (JP)

(73) Assignee: Tokyo Electron Limted, Tokyo (JP)

( * ) Notice: Subject to any disclaimer, the term of this patent is extended or adjusted under 35 U.S.C. 154(b) by 82 days.

(21) Appl. No.: 09/667,502

(22) Filed: Sep. 22, 2000

(30) Foreign Application Priority Data

Oct. 6, 1999 (JP) .............................................. 11-285139

(51) Int. Cl.⁷ .............................................. G01R 31/02
(52) U.S. Cl. ...................... 324/758; 324/158.1; 324/754
(58) Field of Search .................................. 324/754–765

(56) References Cited

U.S. PATENT DOCUMENTS

| | | | | |
|---|---|---|---|---|
| 4,758,785 A | * | 7/1988 | Rath ........................ | 324/158 P |
| 4,934,064 A | | 6/1990 | Yamaguchi et al. | |
| 5,410,259 A | | 4/1995 | Fujihara et al. | |
| 5,436,571 A | | 7/1995 | Karasawa | |
| 5,642,056 A | * | 6/1997 | Nakajima et al. ........... | 324/758 |
| 5,657,394 A | * | 8/1997 | Schwartz et al. ........... | 382/151 |
| 5,773,987 A | | 6/1998 | Montoya | |
| 5,777,485 A | | 7/1998 | Tanaka et al. | |
| 5,804,983 A | * | 9/1998 | Nakajima et al. ........... | 324/758 |
| 5,872,458 A | | 2/1999 | Boardman et al. | |
| 6,037,793 A | | 3/2000 | Miyazawa et al. | |
| 6,501,289 B1 | * | 12/2002 | Takekoshi ................... | 324/758 |

FOREIGN PATENT DOCUMENTS

| | | | |
|---|---|---|---|
| JP | 07-066269 | * | 3/1995 |
| JP | 9-306516 | | 11/1997 |
| JP | 11-30651 | | 2/1999 |

OTHER PUBLICATIONS

U.S. patent application Ser. No. 09/110,073, filed Jul. 2, 1998, pending.

* cited by examiner

*Primary Examiner*—Kamand Cuneo
*Assistant Examiner*—Paresh Patel
(74) *Attorney, Agent, or Firm*—Oblon, Spivak, McClelland, Maier & Neustadt, P.C.

(57) ABSTRACT

A probing method including the steps of moving a main chuck to align an object of inspection on the main chuck with probes of a probe card located over the main chuck. The method includes moving the main chuck toward the probe card, thereby bringing electrodes of the object of inspection into contact with the probes, and overdriving the main chuck toward the probe card while measuring a load applied to the object of inspection by contact with the probe and controlling the movement of the main chuck in accordance with the measured load. The method also includes inspecting the electrical properties of the object of inspection using the probes.

11 Claims, 5 Drawing Sheets

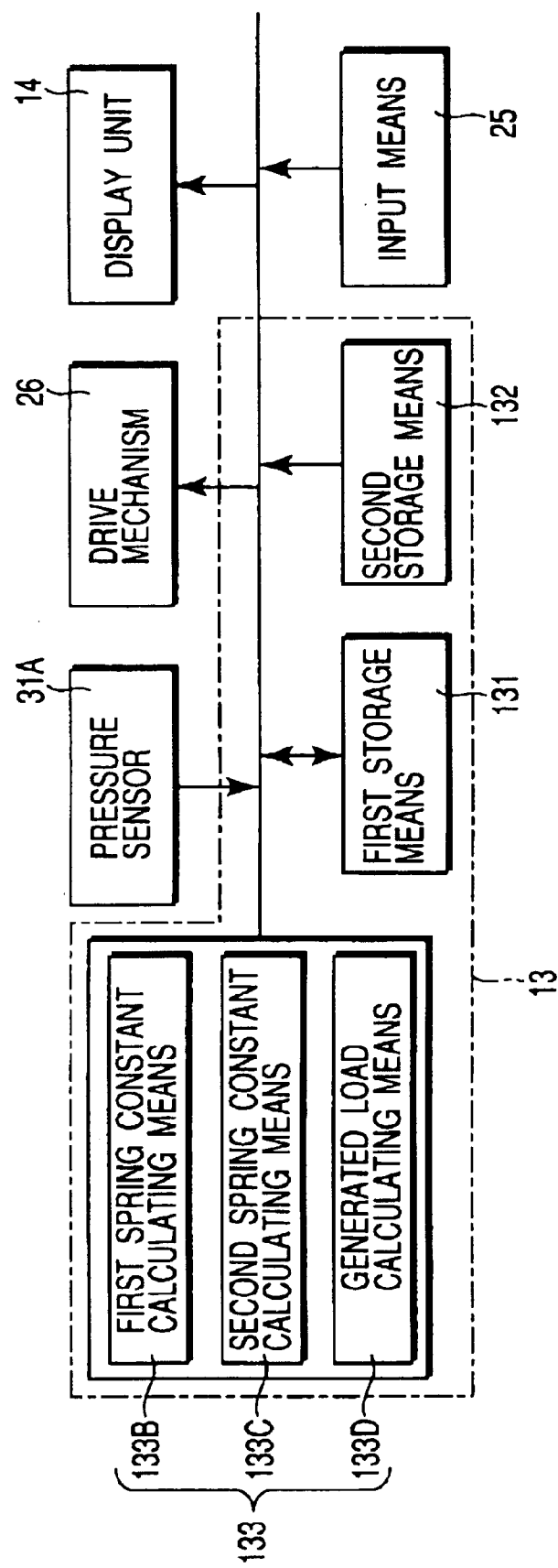
F I G. 7

PROBING METHOD AND PROBING APPARATUS IN WHICH STEADY LOAD IS APPLIED TO MAIN CHUCK

CROSS-REFERENCE TO RELATED APPLICATIONS

This application is based upon and claims the benefit of priority from the prior Japanese Patent Application No. 11-285139, filed Oct. 6, 1999, the entire contents of which are incorporated herein by reference.

BACKGROUND OF THE INVENTION

The present invention relates to a probing method and a probing apparatus, and more specifically, to a probing method and a probing apparatus with high reliability, in which a load applied to a main chuck carrying an object of inspection thereon by probes is measured when the main chuck is overdriven to the probes, so that a steady load can always be applied to the main chuck in accordance with the measured value.

As shown in FIG. 8, a probing apparatus 10 for checking integrated circuits on a wafer for electrical properties, for example, is provided with a loading chamber 11, probing chamber 12, controller 13, and display unit 14. In the loading chamber 11, wafers W stored in a cassette C are delivered one after another and transported to the probing chamber 12. The probing chamber 12 adjoins the loading chamber 11. Integrated circuits formed on each wafer W that is transported from the loading chamber 11 are inspected in the probing chamber 12. The controller 13 controls the chambers 11 and 12. The display unit 14 doubles as a control panel for operating the controller 13.

The loading chamber 11 is provided with a pair of tweezers 15 for use as a transportation mechanism for the wafers W. The tweezers 15 moves back and forth in the horizontal direction and rotates forward and reversely, thereby delivering the wafers W in the cassette C one after another and transporting them into the probing chamber 12. A sub-chuck 16 for pre-aligning each wafer W is provided near the tweezers 15. As the sub-chuck 16 receives each wafer W from the tweezers 15 and rotates in the forward direction and the reverse direction in a θ-direction, it pre-aligns the wafer W on the basis of its orientation flat.

The probing chamber 12 is provided with a main chuck 17 that carriers each wafer W thereon. The main chuck 17 is moved in X- and Y-directions by means of X- and Y-stages 18, 19, respectively, and moved in Z- and θ-directions by means of built-in drive mechanisms. Alignment means 20 is provided in the probing chamber 12. The alignment means 20 serves to align each wafer W with the probes. The alignment means 20 includes an alignment bridge 22 having first image-pickup means (e.g., CCD camera) 21 for imaging the wafer W a pair of guide rails 23 for guiding the bridge 22 in reciprocation in the Y-direction, and second image-pickup means (e.g., CCD camera, not shown) attached to the main chuck 17. A probe card is provided on the top surface of the probing chamber 12. On the upper surface of the probe card, a test head is connected electrically to the card by means of a connecting ring. A test signal from a tester 34 (see FIG. 1) is transmitted to the probe card via the test head and the connecting ring, and further transmitted from the probe card to the wafer W. The object of inspection is checked for electrical properties in accordance with the test signal.

In inspecting the integrated circuits formed on each wafer W, the tweezers 15 takes out one of the wafers W from the cassette C. While the wafer W is being transported to the probing chamber 12, it is pre-aligned on the sub-chuck 16. Thereafter, the tweezers 15 delivers the wafer W to the main chuck 17 in the probing chamber 12. The alignment bridge 22 moves to the center of the probe card. The main chuck 17 moves to the position under the first image-pickup means 21 of the bridge 22, and the wafer on the chuck 17 is aligned with the probe card by means of the first image-pickup means 21 and the second image-pickup means. As the main chuck 17 moves in the X- and Y-directions, the wafer W is subjected to index feed. As the chuck 17 ascends in the Z-direction, the electrodes of the integrated circuits are brought into contact with probes. When the main chuck 17 is overdriven, the integrated circuits on the wafer W are checked for electrical properties with their electrodes electrically in contact with the probes.

In the case of a wafer W with a diameter of 200 mm or less, as shown in FIG. 9A, the wafer W on the main chuck 17 ascends from the position indicated by dashed line to the position indicated by full line as the main chuck 17 is overdriven. As indicated by full line in FIG. 9A, the wafer w rises in the Z-direction without substantially tilting from its horizontal position. As this is done, each probe 24A of a probe card 24 is elastically raised from the position of dashed line to the position of full line of FIG. 9A. The tip of the probe 24A moves from a starting point S to an ending point E, as indicated by thick line. The plane distance covered by the tip that moves from the starting point S to the ending point E, as indicated by hatched arrow in FIG. 9B, is within the area of an electrode pad P of each integrated circuit. Thus, the probe 24A and the electrode pad P are brought electrically into contact with each other, whereupon the integrated circuit is inspected.

In the case of a wafer W with a diameter of 300 mm, the wafer size is too large, and besides, the integrated circuits are hyperfine, and electrode pads are arranged at narrow pitches. The number of pins of the probe card is increased (e.g., to 2,000) correspondingly. A load from about 2,000 probes 24A that acts on the main chuck 17 when the chuck is overdriven is as heavy as, for example, more than 10 kg to 20 kg. Accordingly, an unbalanced load that is generated when the wafer w is overdriven from the position indicated by dashed line in FIG. 10A so that it touches the probes 24A causes the rotating shaft (not shown) of the main chuck 17 to bend. In consequence, the wafer W is tilted for about 20 to 30 μm, for example, as indicated by full line in FIG. 10A, and deflected outward from its original raised position. As this is done, the tip of each probe 24A is elastically raised from the position indicated by dashed line to the position indicated by full line of FIG. 10A, and moves along a track (indicated by thick line in FIG. 10A) that is longer than the one shown in FIG. 9A. Although the starting point S of the tip is situated in the same position as the one shown in FIG. 9A, the ending point E is located outside the area of the electrode pad P, as indicated by hatched arrow in FIG. 10B. Thus, test signals cannot be transmitted from the probes 24A to the electrode pads P, so that the reliability of the inspection is lowered.

In Jpn. Pat. Appln. KOKAI Publication No. 11-30651, the inventor hereof proposed a probing method and a probing apparatus in which dislocation of probes attributable to contact load is corrected three-dimensionally. According to this technique, the probes estimate a distortion of a main chuck in the position where the probes are in contact with a wafer, in accordance with known data, such as information (outside diameter, material, etc.) on the main chuck, information (outside diameter, number of chips, etc.) on the wafer, and information (probe tip area, number of probes, etc.) on a probe card. Based on the estimated value, the position where the probes are in contact with the wafer is corrected three-dimensionally.

BRIEF SUMMARY OF THE INVENTION

According to the probing method and the probing apparatus described in Jpn. Pat. Appln. KOKAI Publication No. 11-30651, a load (needle pressure) in the contact position of the probes is estimated in accordance with the contact position for overdrive operation and a given overdrive, the distortion of the main chuck is estimated according to the estimated load, and the contact position of the probes is three-dimensionally corrected in accordance with the estimated distortion. If the estimated load and an actual load are inconsistent, therefore, the three-dimensional correction of the contact position of the probes may possibly be wrong. Further, the conventional probing method and apparatus use a mechanism that obtains the given overdrive by driving the Z-axis. On the other hand, the distance between the probe tip and the wafer w changes due to deformation of the probe card with time or thermal expansion or contraction of the card during inspection. Since the overdrive of the main chuck is fixed, however, a constant contact load cannot be obtained.

The object of the present invention is to solve the above problems.

An object of the present invention is to bring probes and electrode pads of an object of inspection accurately into contact with one another under a steady load even if a probe card is deformed from various causes or expanded or contracted by any thermal effect.

Another object of the invention is to provide a probing method and a probing apparatus, in which probes and electrode pads of an object of inspection can be brought accurately into contact with one another if a main chuck is tilted by an unbalanced load during overdrive operation, so that high-accuracy inspection can be enjoyed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

In a first aspect of the present invention, there is provided a probing method comprising steps of: moving a main chuck to align an object of inspection on the main chuck with probes of a probe card located over the main chuck; moving the main chuck toward the probe card, thereby bringing electrodes of the object of inspection into contact with the probes; overdriving the main chuck toward the probe card while measuring a load applied to the object of inspection by contact with the probes and controlling the movement of the main chuck in accordance with the measured load; and inspecting electrical properties of the object of inspection by means of the probe.

Preferably, in this probing method, the control of the movement of the main chuck is control of an overdrive based on the measured load, such that the load has a given value.

Preferably, in this probing method, the control of the movement of the main chuck further includes steps of obtaining a distortion of the main chuck in accordance with the measured load and correcting at least one of dislocations between the object of inspection and the probe in X-, Y-, and θ-directions in accordance with the distortion.

Preferably, in this probing method, the measurement of the load applied to the object of inspection by contact with the probes includes steps of locating a polishing mechanism right under the probes, the polishing mechanism including a polish plate to be used to polish the tip of the probes; moving the located polishing mechanism toward the probe card, thereby bringing the polish plate into contact with the probes; overdriving the polishing mechanism toward the probe card; and measuring a load applied to the polish plate by the probes by means of a pressure sensor attached to the polishing mechanism during the overdrive operation.

In a second aspect of the present invention, there is provided a probing method comprising steps of: moving a main chuck in X-, Y-, and θ-directions to align an object of inspection on the main chuck with probes of a probe card located over the main chuck; moving the main chuck in a Z-direction, thereby bringing electrodes of the object of inspection into contact with the probes; overdriving the main chuck toward the probe card while measuring a load applied to the object of inspection by contact with the probes by means of a sensor and controlling the movement of the main chuck in accordance with the measured load; and inspecting electrical properties of the object of inspection by means of the probes.

Preferably, in this probing method, the sensor is located on at least one of the lower part of the main chuck and between an LM guide and an XY-stage on which the main chuck is set.

Preferably, in this probing method, the control of the movement of the main chuck is control of an overdrive of the main chuck.

Preferably, in this probing method, the control of the movement of the main chuck includes steps of obtaining a distortion of the main chuck in accordance with the measured load and correcting at least one of dislocations between the object of inspection and the probes in the X-, Y-, and θ-directions in accordance with the distortion.

In a third aspect of the invention, there is provided a probing method in which a main chuck is moved in X-, Y-, and θ-directions to align an object of inspection on the main chuck with probes of a probe card located over the main chuck, the main chuck is moved in a Z-direction so that electrodes of the object of inspection are brought into contact with the probes, the main chuck is overdriven toward the probe card, and electrical properties of the object of inspection are inspected by means of the probes, the probing method comprising steps of: locating a polishing mechanism right under the probes, the polishing mechanism including a polish plate to be used to polish the tip of the probes; moving the located polishing mechanism toward the probe card, thereby bringing the polish plate into contact with the probes; overdriving the polishing mechanism toward the probe card; measuring a load applied to the polish plate by the probes by means of a pressure sensor during the overdrive operation; and controlling the movement of the main chuck in accordance with the measured load.

Preferably, in this probing method, the sensor is set on the polishing mechanism.

Preferably, in this probing method, the control of the movement of the main chuck is control of an overdrive of the main chuck.

Preferably, this probing method comprises steps of obtaining a distortion of the main chuck in accordance with the measured load and correcting at least one of dislocations between the object of inspection and the probes in the X-, Y-, and θ-directions in accordance with the distortion.

Preferably, in this probing method, the control of the overdrive of the main chuck includes steps of obtaining a distortion of the polish plate in accordance with the relation between the load applied to the polish plate and the distortion of the polish plate and the load applied to the polish plate and measured by means of the pressure sensor; obtaining the spring constant of the probes from the distortion and an overdrive of the polish plate; obtaining the spring constant of the main chuck in accordance with the spring constant of the probes and the relation between the load and a distortion of the main chuck; obtaining a load applied to the main chuck by the probes in accordance with the spring constant of the main chuck and the relation between the spring constant and the overdrive of the main chuck; and controlling the overdrive of the main chuck in accordance with the obtained load.

Preferably, this probing method further comprises steps of obtaining a distortion of the main chuck in accordance with the load measured:by means of the pressure sensor and correcting dislocations between the object of inspection and the probe in X- and Y-directions in accordance with the distortion.

In a fourth aspect of the invention, there is provided a probing apparatus comprising: a main chuck carrying an object of inspection thereon; a probe card having a plurality of probes and located over the main chuck; a drive mechanism for moving the main chuck in X-, Y-, Z-, and θ-directions; a pressure sensor adapted to measure a load applied to the object of inspection by the probes when the drive mechanism moves the main chuck toward the probe card so that the object of inspection on the main chuck is brought into contact with probes; and a controller for controlling the movement of the main chuck in accordance with a position where the probes touches the object of inspection and the load measured by means of the pressure sensor.

In a fifth aspect of the invention, there is provided a probing apparatus comprising: a main chuck carrying an object of inspection thereon; a probe card having a plurality of probes and located over the main chuck; a drive mechanism for moving the main chuck in X-, Y-, Z-, and θ-directions; a pressure sensor adapted to measure a load applied to the object of inspection by the probes when the drive mechanism moves the main chuck toward the probe card so that the object of inspection on the main chuck is brought into contact a probes; and a controller for obtaining a distortion of the main chuck in accordance with a position where the probes touches the object of inspection and the load measured by means of the pressure sensor.

Preferably, the controller of this probing apparatus controls an overdrive in accordance with the measured load so that the load has a given value.

Preferably, the controller of this probing apparatus corrects at least one of dislocations between the object of inspection and the probes in the X-, Y-, and θ-directions in accordance with the distortion.

In a sixth aspect of the invention, there is provided a probing apparatus comprising: a main chuck carrying an object of inspection thereon; a polishing mechanism having a polish plate and attached to the main chuck; a probe card having a plurality of probes and located over the main chuck; a drive mechanism for moving the main chuck in X-, Y-, Z-, and θ-directions; a pressure sensor adapted to measure a load applied to the polish plate of the polishing mechanism attached to the main chuck by the probes when the drive mechanism moves the main chuck toward the probe card so that the polish plate is brought into contact with probes; and a controller for controlling the drive mechanism, the controller including a mechanism for obtaining the spring constant of the probes in accordance with the load measured by means of the pressure sensor, obtaining the spring constant of the stage in accordance with the relation between the load and a distortion of the main chuck, and obtaining a load applied in the position where the probes touch the main chuck in accordance with the relation between the respective spring constants of the probes and the main chuck and an overdrive of the main chuck.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A and 5B illustrate the operation of the wafer and the probe shown in FIG. 4, in which FIG. 5A is a diagram for illustrating the respective behaviors of the wafer and the probe, and FIG. 5B is a diagram for illustrating the trace of the tip of the probe on an electrode pad;

FIG. 7 is a block diagram showing the principal part of the probing apparatus shown in FIG. 6;

DETAILED DESCRIPTION OF THE INVENTION

Figure 1:
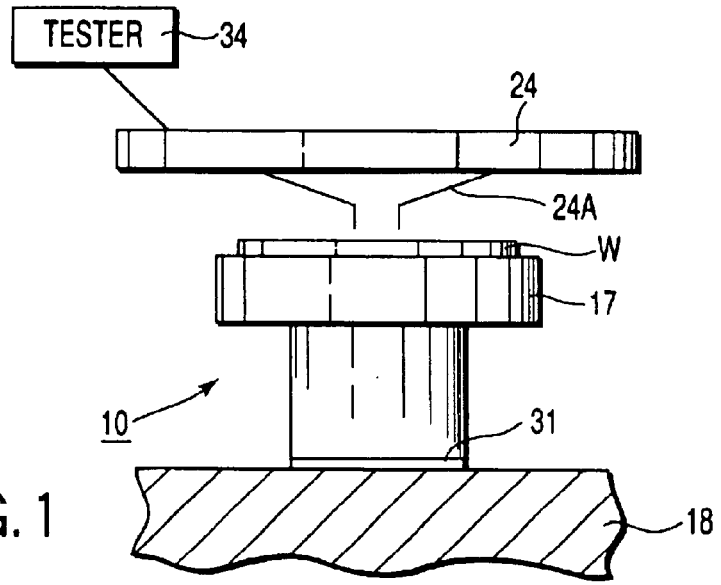
FIG. 1 is a side view showing the principal part of one embodiment of a probing apparatus according to the present invention.

A probing method and a probing apparatus according to the present invention can be used to check integrated circuits on a wafer for electrical properties. Alternatively, however, the invention may be applied to the inspection of the electrical properties of general electronic components such as LCD's.

In order to explain the present invention more specifically and definitely, there will be described a case in which the invention is applied to the inspection of the electrical properties of integrated circuits formed on a wafer.

The invention will be described in connection with embodiments shown in FIGS. 1 to 7, in which like reference numerals refer to like or equivalent portions throughout the several views.

Figure 8:
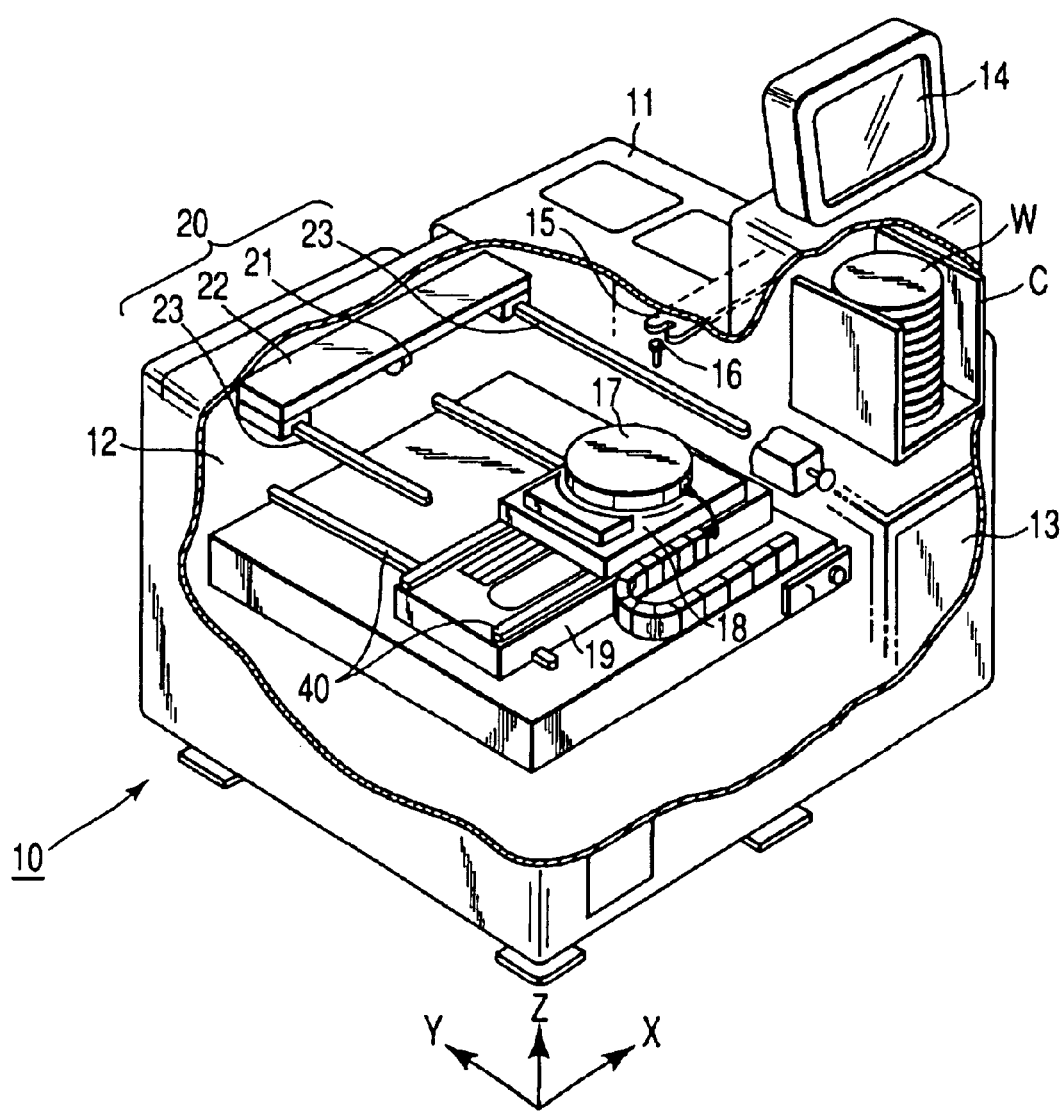
FIG. 8 is a cutaway perspective view of a conventional probing apparatus.

A probing apparatus 10 according to an embodiment of the invention, like the probing apparatus shown in FIG. 8, may be provided with a loading chamber 11 and a probing chamber 12. Alternatively, however, the loading chamber 11 and the probing chamber 12 may be arranged separately. The tweezers 15 and a sub-chuck 16 are arranged in the loading chamber 11. Wafers W in a cassette C are transported one after another by means of the tweezers 15. In this process of transportation, each wafer W can be pre-aligned by means of the sub-chuck 16. A main chuck 17, which is movable in Z- and θ-directions, X-stage 18, Y-stage 19, and alignment means are arranged in the probing chamber 12. As the main chuck 17 moves in X-, Y-, Z-, and θ-directions under the control of a controller 13, it aligns the wafer W thereon with a probe card in conjunction with the alignment means 20. After the alignment, the main chuck ascends in the Z-direction, whereupon integrated circuits formed on the wafer W is checked for electrical properties with its electrodes electrically in contact with a probe 24A.

Figure 2:
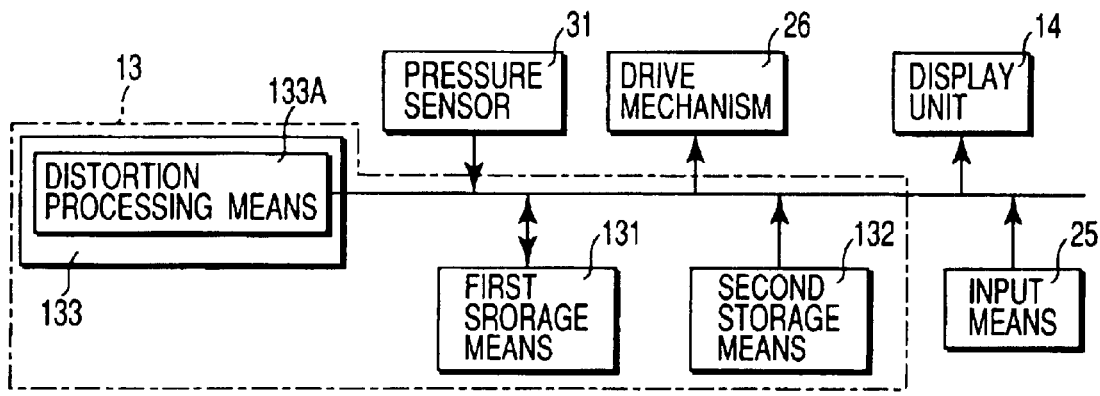
FIG. 2 is a block diagram showing the principal part of the probing apparatus shown in FIG. 1.

According to the present embodiment, a pressure sensor (e.g., load cell) 31 is provided for the measurement of load. Although the pressure sensor 31 is located between the main chuck 17 and the X-table 18 in the arrangement shown in FIG. 1, the location of the sensor is not limited to this position. For example, the sensor 31 may be located between an X, Y-table and an LM guide 40 (FIG. 8). The pressure sensor 31 is used to measure load from the probe 24A that acts on the wafer W on the main chuck 17. As shown in FIG. 2, the sensor 31 is connected to the controller 13. The controller serves to control the movement of the main chuck in accordance with a signal measured by means of the pressure sensor 31. By this control, the overdrive can be adjusted so that the load from the probe 24A that acts on the wafer W is constant. Alternatively, under this control, the distortion of the main chuck may be obtained from the measured load so that at least one of dislocations between the object of inspection and the probe in the X-, Y-, and θ-directions can be corrected in accordance with the distortion. The adjustment of the overdrive and correction of the dislocation between the object of inspection and the probe can be carried out in combination with each other.

As shown in FIG. 2, the controller 13 can comprises first storage means 131 for storing data such as wafer information on the wafers W, card information on the probe card, etc., second storage means 132 for storing data such as control programs for the probing apparatus, main chuck information on the main chuck 17, and a central processing unit (hereinafter referred to as "CPU") 133. The CPU 133 can read the individual pieces of information stored in the first and second storage means 131 and 132 and carry out processes based on predetermined programs.

The wafer information may include parameters such as the location of each chip, chip size, position of the center of gravity of the chip, number of electrode pads, pitches between the electrode pads, etc. The card information may include parameters such as the number of probe needles (number of pins), location of the probe needles, material and properties of the probe needles, etc. The main chuck information may include parameters such as the mechanical strength of the rotating shaft of the main chuck 17, outside diameter and load-distortion data of the chuck 17, etc. The load-distortion data may be defined as data that are indicative of load on a typical point on the upper surface of main chuck 17 and the relation between the load and the distortion of the chuck 17. The CPU 133 includes the measured load (needle pressure) of the pressure sensor 31 and distortion processing means 133A. The processing means 133A obtains the distortion of the main chuck 17 for a probe contact position in an overdrive mode in accordance with the load-distortion data of the main chuck and the wafer information. The distortion processing means 133A is used to obtain the distortion of the main chuck 17 in accordance with the measured load of the pressure sensor 31 for the contact position of the probe 24A and the load-distortion data.

As shown in FIG. 2, input means (e.g., keyboard, etc.) 25 and the display unit 14 are connected to the controller 13. Necessary data for various inspections, such as the wafer information and main chuck information, are inputted by means of the input means 25. The input data are recognized by the display unit 14. A drive mechanism 26 is connected to the controller 13. The drive mechanism 26 serves to drive the main chuck 17.

The following is a description of the probing method and the operation of the probing apparatus. Before the wafers W are inspected, the wafer information and the card information are inputted by the input means 25. The input data are recognized on a display screen. If the input data are correct, they are stored in the first storage means 131. The wafers W in each cassette are fed into the probing apparatus 10. After each wafer W is pre-aligned in the loading chamber, it is fed onto the main chuck 17 in the probing chamber. In the probing chamber, the wafer W is aligned with the probe 24A by means of the alignment means. The electrical properties of each chip of the wafer W are successively inspected by means of the probe 24A.

Figure 3:
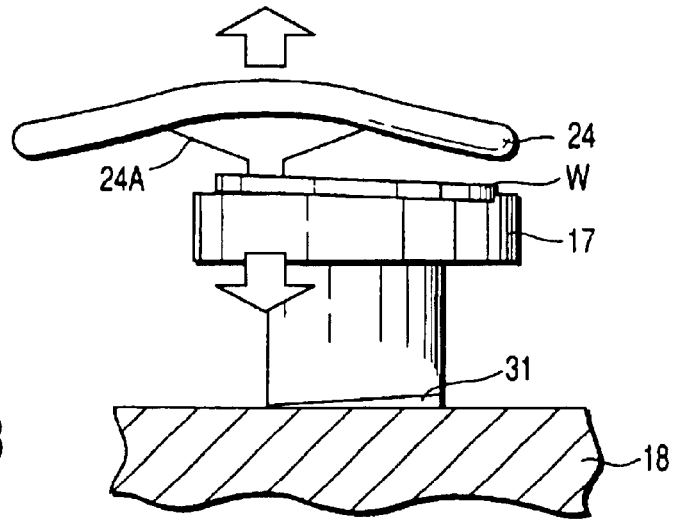
FIG. 3 is a view illustrating the operation of the principal part of the probing apparatus shown in FIG. 2.

In the inspection of each chip, the probing apparatus 10 is actuated in accordance with programs for the probing method of the invention read from the second storage means 13 by means of the CPU 133. The first one of the integrated circuits on the wafer W to be measured is settled. The CPU 133 subjects the main chuck 17 to index feed, whereupon the integrated circuits on the wafer w are inspected in succession. In the inspection of each integrated circuit, the main chuck 17 is overdriven after it ascends to a position where the wafer W and the probe 24A are in contact with each other. During the overdrive operation, the pressure sensor 31 measures load (needle pressure) between the probe 24A and the wafer W. The overdrive is monitored in accordance with the measured load. When a preset load value is measured by means of the pressure sensor 31, the controller 13 stops the operation of the drive mechanism 26, thereby stopping the main chuck 17, whereupon a fixed overdrive can be secured. The main chuck 17 tilts as it is subjected to an unbalanced load during the overdrive operation. FIG. 3 exaggeratingly shows the tilted sate of the main chuck. In FIG. 3, arrows indicate a contact load and its reaction force, individually.

In the conventional probing method, the overdrive is controlled by fixing the ascent of the main chuck 17 in the Z-direction. Accordingly, the position of the tip of the probe 24A is vertically deviated from its reference position, due to thermal expansion of the probe card 24 that is caused when the wafer W is heated during the inspection, contraction of the card 24 that is caused when the wafer W is cooled, or deformation (exaggerated in FIG. 3) of the card 24 with time. Thus, the conventional probing method cannot secure an overdrive that matches the actual distance between the probe 24A and the wafer W. In consequence, the contact load and the tip position fluctuate depending on the spot of contact of the probe, so that it is hard to effect steady inspection.

According to the present embodiment, the pressure sensor measures the contact load (needle pressure) between the probe 24A and the wafer W. Since the overdrive is controlled according to this measured load, steady inspection can be carried out under a constant contact load (needle pressure) without being influenced by any thermal effect or deformation of the probe card 24 with time.

According to the present embodiment, the contact position of the probe 24A can be corrected three-dimensionally during the overdrive operation. The method of the present embodiment, unlike a probing method proposed in Jpn. Pat. Appln. KOKAI Publication No. 9-306516, can three-dimensionally correct the contact position of the probe 24A in accordance with the measured load from the probe 24A that acts on the main chuck 17. According to the method described in Jpn. Pat. Appln. KOKAI Publication No. 9-306516, the contact load produced by the probe is estimated, distortion of the main chuck 17 is obtained from the estimated value, and the contact position of the probe 24A is three-dimensionally corrected in accordance with the distortion.

Figure 4:
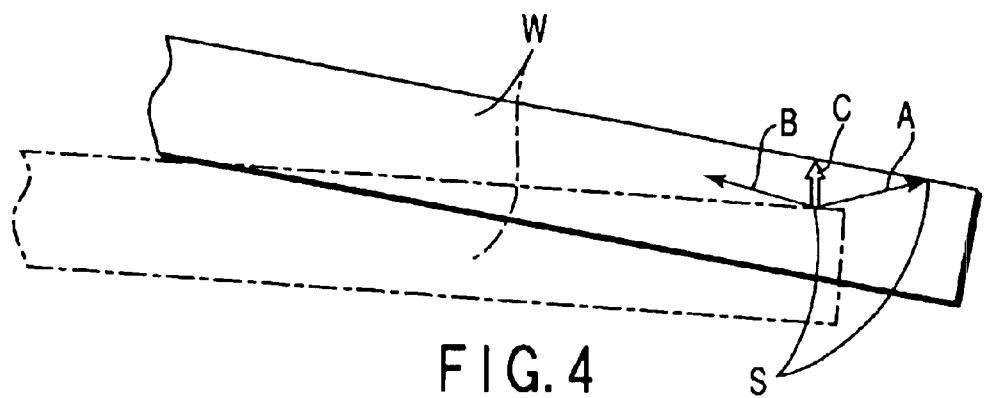
FIG. 4 is a diagram for illustrating the operation of a wafer on a main chuck shown in FIG. 2 and a probe.
Figure 5A:
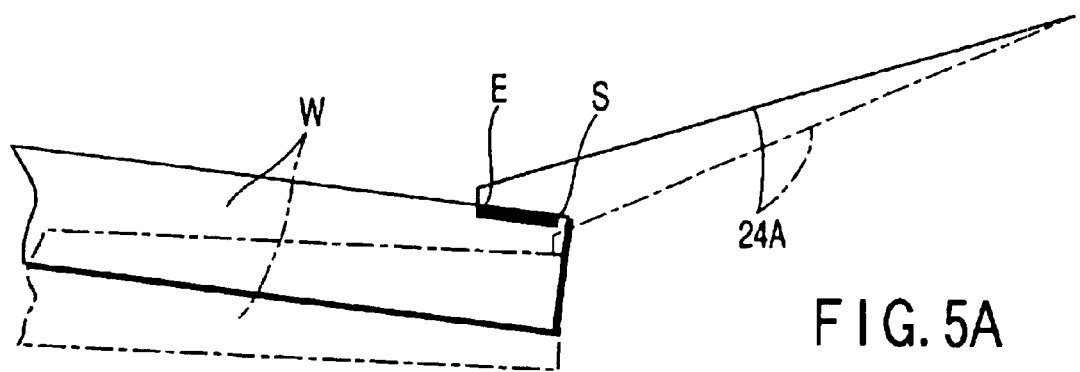
Figure 5B:
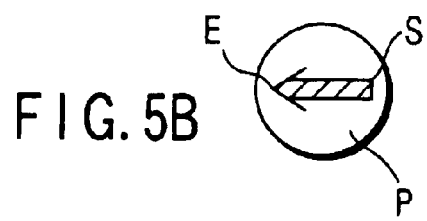
Figure 9A:
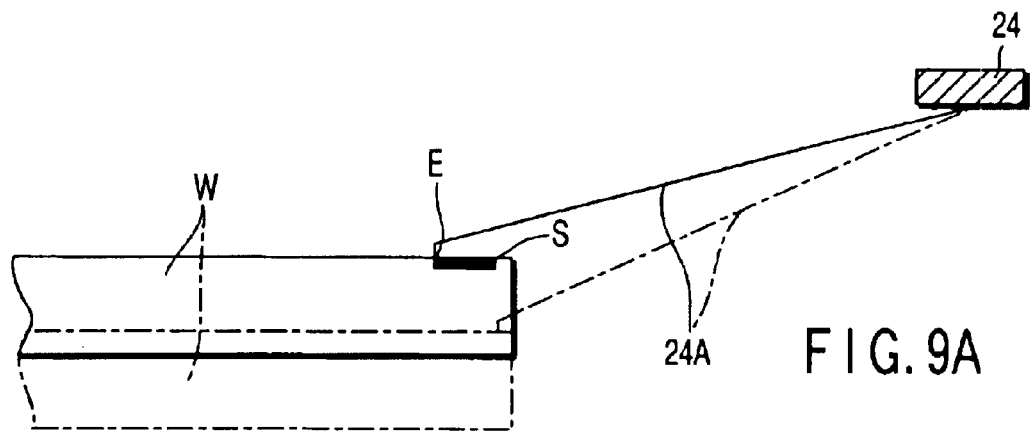
FIG. 9A is a partially enlarged conceptual diagram showing the relation between a main chuck and a probe established when the main chuck is overdriven under a single-pin probe card.
Figure 9B:
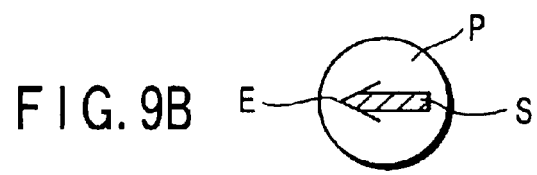
FIG. 9B is a diagram for illustrating the relation between an electrode pad and the trace of the tip of the probe in the state shown in FIG. 9A.
Figure 10A:
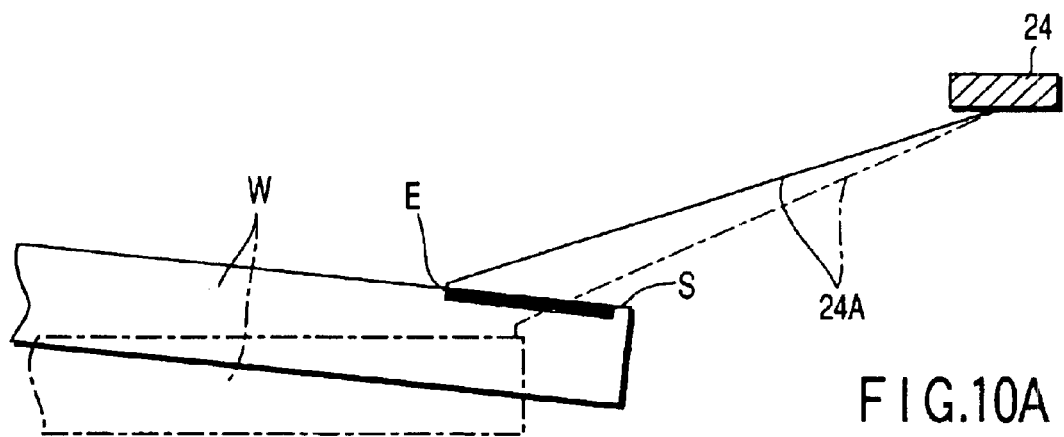
FIG. 10A is a partially enlarged conceptual diagram showing the relation between the main chuck and the probe established when the main chuck is overdriven under a multi-pin probe card.
Figure 10B:
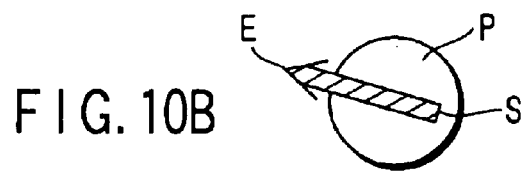
FIG. 10B is a diagram for illustrating the relation between the electrode pad and the trace of the tip of the probe in the state shown in FIG. 10A.

As the wafer W, which is in contact with the probe 24A in the position indicated by dashed line in FIG. 4, is overdriven to the position indicated by full line, it is subjected to an unbalanced load from the probe 24A, and the main chuck 17 is tilted by the unbalanced load. In consequence, the wafer W tilts outward from its original position, and the a starting point S of the tip of the probe 24A is urged to move in the direction indicated by arrow A in FIG. 4. According to the present embodiment, the distortion processing means 133A obtains distortion for the load measured by means of the pressure sensor 31, in accordance with the measured load and the load-distortion data. Based on this distortion, the movement of the main chuck 17 is corrected by means of the drive mechanism 26, and the wafer W moves in the direction of arrow B in FIG. 4. Thus, the moving direction of the main chuck 17 is corrected according to the load measured by means of the pressure sensor 31. Accordingly, the wafer W ascends as if it were kept horizontal, and the tip of the probe 24A is vertically lifted upward, as indicated by arrow C. In consequence, the probe tip moves on a track that is hardly different from the track for the case where the wafer w is lifted horizontally (see FIG. 9). As shown in FIG. 5B, an ending point E of the tip remains in an electrode pad P. In consequence, the probe 24A comes securely into contact with the given electrode pad P, so that the inspection of the integrated circuits can be carried out securely and steadily.

According to the present embodiment, as described above, the load that is produced as the probe 24A touches the wafer w is measured by means of the pressure sensor 31 when the main chuck 17 is overdriven under the control of the controller 13. The overdrive of the main chuck 17 or the position of the wafer W relative to the position of the probe is corrected according to the measured load. If the probe card 24 is deformed by any thermal effect or use, therefore, the probe 24A can touch the wafer w under a constant needle pressure. Alternatively, the probe 24A can steadily touch a given position on the wafer W. In consequence, highly reliable inspection can be carried out.

If the diameter of the wafer W and the number of pins of the probe card 24 are increased, moreover, the main chuck 17 is tilted by the unbalanced load during the overdrive operation. However, the pressure sensor 31 can measure the unbalanced load, and the contact position of the probe 24A can be corrected according to the measured load and the load-distortion data of the main chuck 17. In consequence, the position of the main chuck can be highly accurately corrected without being influenced by deformation that is attributable to heat from the probe card 24 or use. As shown in FIG. 5B, the probe 24A can be securely brought into electrical contact with the electrode pad P of each integrated circuit in any spot on the wafer W, so that high-reliability inspection can be carried out securely.

Figure 6:
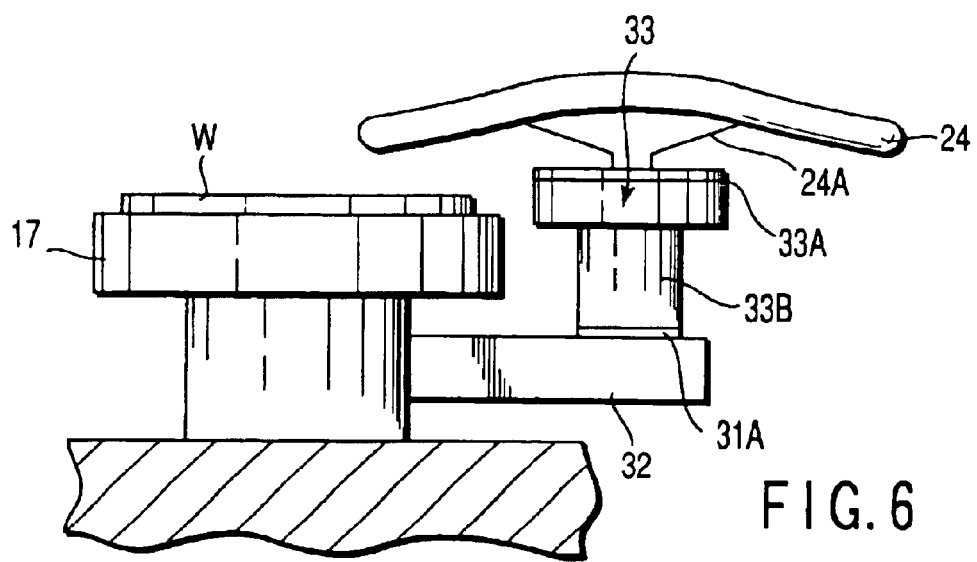
FIG. 6 is a side view showing another embodiment of the probing apparatus according to the invention.

FIGS. 6 and 7 show another embodiment of the present invention. According to the present embodiment, as shown in FIG. 6, a support arm 32 extends horizontally from a straight trunk portion of a main chuck 17. The arm 32 is provided with a polishing mechanism 33 for polishing a probe 24A. The mechanism 33 includes a polish plate 33A for polishing the probe 24A and a support block 33B for supporting the polish plate 33A. The polishing mechanism 33 overdrives the main chuck 17 to bring the probe 24A into contact with the polish plate 33A, thereby polishing the probe 24A. A pressure sensor 31A (e.g., load cell) is located between the support arm 32 and the support block 33B. The sensor 31A measures load that is applied to the polish plate 33A during overdrive operation. The relation between the measured load and a distortion of the polishing mechanism 33, like the load-distortion data of the main chuck 17, is measured in advance and loaded as load-distortion data of the polishing mechanism 33 in second storage means 132.

As shown in FIG. 7, a controller 13 according to the present embodiment comprises first spring constant calculating means 133B, second spring constant calculating means 133C, and generated load calculating means 133D. Based on the load measured by means of the pressure sensor 31A, the first spring constant calculating means 133B obtains a spring constant KP of the probe 24A. Based on the relation between the load and distortion of the main chuck 17, the second spring constant calculating means 133C obtains a spring constant KC of the chuck 17. Based on the relation between the spring constant KP of the probe 24A, the spring constant KC of the main chuck 17, and an overdrive OD of the chuck 17, the generated load calculating means 133D obtains a generated load GC in the position of contact between the probe 24A and the chuck 17. Based on the measured load from the pressure sensor 31A and the load-distortion data of the polishing mechanism 33, as mentioned before, the controller 13 can obtain a distortion of the main chuck 17 during inspection with high accuracy.

More specifically, the polish plate 33A is brought into contact with the probe 24A when a given overdrive (X) is attained. The pressure sensor 31A measures a load (G) at that time. An overdrive that then affects the probe 24A is obtained as (B−X) from the relation between the aforesaid overdrive (X) and a distortion (B) for the load (G) of the load-distortion data of the polishing mechanism 33 loaded in the second storage means 132. Further, the first spring constant calculating means 133B obtains the spring constant KP of the probe 24A according to Equation (1) as follows:

$$KP=G/(B-X). \tag{1}$$

The second spring constant calculating means 133C obtains the spring constant KC of the main chuck 17 from the relation between load-distortion data loaded in a main chuck information storage unit. The generated load calculating means 133D obtains the overdrive OD of the main chuck 17 according to Equation (2), and the then generated load GC can be obtained according to Equation (3) as follows:

$$OD=ODP+ODC, \qquad (2)$$

$$GC=KP*ODP=KC*ODC, \qquad (3)$$

where ODP is an overdrive on the probe 24A and ODC is an overdrive on the main chuck 17.

As seen from Equations (2) and (3), the overdrive OD and the generated load GC on the main chuck 17 have the relation given by Equation (4) as follows:

$$GC=[(KP*KC)/(KP+KC)]*OD, \qquad (4)$$

where the spring constants KP and KC are known amounts.

Equation (4) is stored in a main chuck information storage unit 132A of the controller 13. During the inspection of the wafer W, as mentioned before, a CPU 133 can obtain the generated load GC on the main chuck 17 from the overdrive OD of the chuck 17, and besides, the load GC generated according to the overdrive OD for each moment can be monitored in order. Steady inspection can be securely carried out by controlling the movement of the main chuck so that the overdrive is constant in accordance with the generated load GC.

If a probe card 24 is deformed with time, according to the present embodiment, a load reflective of the deformation of the probe card 24 can be monitored even during the inspection of the wafer W, since the generated load GC that reflects the deformation is measured. Probe cards 24 of the same type are distorted somewhat differently and cannot be guaranteed exactly the same shape. Even in this case, the load GC from the probe 24A that is applied to the polish plate 33A in the polishing mechanism 33 is measured, so that the load on the main chuck 17 that is reflective of the shape of each probe card 24 can be monitored.

If an unbalanced load is applied to the main chuck 17 during the inspection of the wafer W, according to the present embodiment, the load on the chuck 17 can be monitored in the aforesaid manner. Thus, the accuracy of three-dimensional correction of the probe 24A can be improved, and the probe 24A can be securely brought into contact with an electrode pad P. In consequence, functions and effects similar to those of the foregoing embodiment can be enjoyed.

The present invention is not limited to the embodiments described above. According to the above description, the pressure sensor 31 is located between the main chuck 17 and the X-stage 18, for example. However, the pressure sensor may be set in any place that allows the load on the chuck 17 to be measured. The same applies to the pressure sensor on the polishing mechanism. After all, the probing method and the probing apparatus of the present invention comprehend any of probing methods and probing apparatuses in which load (needle pressure) from a probe that is applied to a main chuck is monitored during the inspection of wafers, the overdrive of the main chuck is controlled in accordance with the monitored load, and the position of contact of the probe is corrected three-dimensionally.

According to the present invention, as described herein, the probe can be brought accurately into contact with the electrode pad of the object of inspection even if the probe card is deformed from various causes or expanded or contracted by any thermal effect. If the main chuck is tilted by an unbalanced load during overdrive operation, moreover, the probe can accurately touch the electrode pad of the object of inspection, so that high-accuracy inspection can be enjoyed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A probing method comprising steps of:
    moving a main chuck to align an object of inspection on the main chuck with probes of a probe card located over the main chuck;
    moving the main chuck toward the probe card, thereby bringing electrodes of the object of inspection into contact with the probes;
    overdriving the main chuck toward the probe card while measuring a load applied to the main chuck by contact with the probes and controlling the movement of the main chuck in accordance with the measured load; and
    inspecting electrical properties of the object of inspection using the probes.

2. A probing method according to claim 1, wherein said control of the movement of the main chuck is control of an overdrive based on the measured load, such that the load has a given value.

3. A probing method according to claim 1 or 2, wherein said control of the movement of the main chuck includes steps of obtaining a distortion of the main chuck in accordance with the measured load and correcting at least one of dislocations between the object of inspection and the probe in X-, Y-, and θ-directions in accordance with the distortion.

4. A probing method comprising steps of:
    moving a main chuck in X-, Y-, and θ-directions to align an object of inspection on the main chuck with probes of a probe card located over the main chuck;
    moving the main chuck in a Z-direction, thereby bringing electrodes of the object of inspection into contact with the probes;
    overdriving the main chuck toward the probe card while measuring a load applied to the main chuck by contact with the probes using a sensor and controlling the movement of the main chuck in accordance with the measured load; and
    inspecting electrical properties of the object of inspection using the probes.

5. A probing method comprising steps of:
    moving a main chuck in X-, Y-, and θ-directions to align an object of inspection on the main chuck with probes of a probe card located over the main chuck;
    moving the main chuck in a Z-direction, thereby brining electrodes of the object of inspection into contact with the probes;
    overdriving the main chuck toward the probe card while measuring a load applied the object of inspection by contact with the probes using a sensor and controlling the movement of the main chuck in accordance with the measured load; and
    inspecting electrical properties of the object of inspection using the probes,
    wherein said sensor is located on at least one of the lower part of the main chuck and between an LM guide and an XY-stage on which the main chuck is set.

6. A probing method according to claim 4, wherein said control of the movement of the main chuck is control of an overdrive of the main chuck.

7. A probing method according to claims 4 or 6, wherein said control of the movement of the main chuck includes steps of obtaining a distortion of the main chuck in accordance with the measured load and correcting at least one of dislocations between the object of inspection and the probes in the X-, Y-, and θ-directions in accordance with the distortion.

8. A probing apparatus comprising:

a main chuck carrying an object of inspection thereon;

a probe card having a plurality of probes and located over the main chuck;

a drive mechanism for moving the main chuck in X-, Y-, Z-, θ-directions;

a pressure sensor adapted to measure a load applied to the main chuck by the probes when the drive mechanism moves the main chuck toward the probe card so that the object of inspection on the main chuck is brought into contact with probes; and a controller for controlling the movement of the main chuck in accordance with a position where the probes touches the object of inspection and the load measured using the pressure sensor.

9. A probing apparatus comprising:

a main chuck carrying an object of inspection thereon;

a probe card having a plurality of probes and located over the main chuck;

a drive mechanism for moving the main chuck in X-, Y-, Z-, θ-directions;

a pressure sensor adapted to measure a load applied to the object of inspection by the probes when the drive mechanism moves the main chuck toward the probe card so that the object of inspection on the main chuck is brought into contact with the probes; and a controller for obtaining a distortion of the main chuck in accordance with a position where the probes touches the object of inspection and the load measured using the pressure sensor.

10. A probing apparatus according to claim 8 or 9, wherein said controller controls an overdrive in accordance with the measured load so that the load has a given value.

11. A probing apparatus according to claim 9, wherein said controller corrects at least one of dislocations between the object of inspection and the probes in the X-, Y-, and θ-directions in accordance with the distortion.

* * * * *